United States Patent [19]

Serizawa et al.

[11] Patent Number: 5,093,831
[45] Date of Patent: Mar. 3, 1992

[54] FAST CALCULATION CIRCUIT FOR CYCLIC REDUNDANCY CHECK CODE

[75] Inventors: Shouichi Serizawa, Odawara; Tokuhiro Tsukiyama, Kanagawa; Tadashi Haga, Joetsu, all of Japan

[73] Assignees: Hitachi, Ltd.; Hitachi Computer Peripherals Co., Ltd., both of Tokyo, Japan

[21] Appl. No.: 362,221

[22] Filed: Jun. 6, 1989

[30] Foreign Application Priority Data

Jun. 9, 1988 [JP] Japan .............................. 63-140571

[51] Int. Cl.⁵ ...................... G06F 11/10; H03M 13/00
[52] U.S. Cl. .................................................... 371/37.1
[58] Field of Search ................... 371/37.1, 37.7, 40.1, 371/41

[56] References Cited

U.S. PATENT DOCUMENTS

| | | | |
|---|---|---|---|
| 3,988,677 | 10/1976 | Fletcher et al. | 371/39.1 |
| 4,185,190 | 1/1980 | Bottard et al. | 371/16.1 |
| 4,709,367 | 11/1987 | Grafe et al. | 371/40.1 |
| 4,720,831 | 1/1988 | Joshi et al. | 371/37.1 |
| 4,723,243 | 2/1988 | Joshi et al. | 371/37.1 |
| 4,723,244 | 2/1988 | Iacoponi | 371/37.1 |
| 4,771,429 | 9/1988 | Davis et al. | 371/37.1 |
| 4,809,274 | 2/1989 | Walker et al. | 371/37.1 |
| 4,872,009 | 10/1989 | Tsukiyama et al. | 360/48 |
| 4,899,147 | 2/1990 | Schiavo et al. | 364/200 |
| 4,929,946 | 5/1990 | O'Brien et al. | 341/87 |

FOREIGN PATENT DOCUMENTS 57-25046 2/1982 Japan .

*Primary Examiner*—Jerry Smith
*Assistant Examiner*—Phung My Chung
*Attorney, Agent, or Firm*—Fay, Sharpe, Beall, Fagan, Minnich & McKee

[57] ABSTRACT

A fast calculation circuit for a cyclic redundancy check code of compressed data having a compressed area and an uncompressed area, the compressed area containing at least a data byte representative of the content of consecutive same data bytes and a data byte representative of the number of consecutive same data bytes. The fast calculation circuit includes a cyclic redundancy check code calculation unit for calculating a cyclic redundancy check code of data in the uncompressed area by using a generating polynominal; a fast calculation matrix unit for storing beforehand a plurality of cyclic redundancy check code calculation results of data contents and consecutive data byte numbers; and a detection unit for detecting the compressed area; wherein when the detection unit detects the compressed area, a cyclic redundancy check code of data in the detected compressed area is calculated by the fast calculation matrix unit, and when the detection unit does not detect the compressed area, a cyclic redundancy check code of data in the uncompressed area is calculated by the cyclic redundancy check code calculation unit.

7 Claims, 3 Drawing Sheets

FIG. 3

| COMPRESSED RAW DATA CONTENT \ COMPRESSED DATA BYTE NUMBER (IN COMPRESSED DATA BYTE NUMBER LATCH 10) | 1 | 2 | 3 | 4 | 5 | 6 | 7 | ------ | 255 |
|---|---|---|---|---|---|---|---|---|---|
| 00 | 1A | FB | 53 | E9 | 71 | 0C | 55 | ------ | 99 |
| 01 | D0 | 22 | BA | AA | 6F | C4 | DF | ------ | F7 |
| 02 | 8E | E1 | 30 | 11 | CD | 44 | A6 | ------ | 40 |
| 03 | 9E | AF | 16 | 3D | E4 | B2 | 77 | ------ | 69 |
| ⋮ | ⋮ | ⋮ | ⋮ | ⋮ | ⋮ | ⋮ | ⋮ | ------ | --- |
| FF | 2C | E1 | 37 | 50 | 0F | 88 | 74 | ------ | 89 |

FIG. 4

| PREVIOUS CALCULATION RESULT BEFORE INPUT OF CONSECUTIVE DATA \ COMPRESSED DATA NUMBER (NUMBER OF IDLE SHIFTS) | 1 | 2 | 3 | 4 | ------ | 255 |
|---|---|---|---|---|---|---|
| 00 | 39 | 82 | D2 | 33 | ------ | AF |
| 01 | 12 | 4E | 97 | 10 | ------ | 13 |
| 02 | FF | 57 | 2D | 64 | ------ | 29 |
| ⋮ | ⋮ | ⋮ | ⋮ | ⋮ | ------ | ⋮ |
| FF | DC | 92 | EC | 80 | ------ | FE |

FAST CALCULATION CIRCUIT FOR CYCLIC REDUNDANCY CHECK CODE

BACKGROUND OF THE INVENTION

The present invention relates to a fast calculation circuit for a cyclic redundancy check code used in detecting data error, and more particularly to a fast calculation circuit capable of calculating at high speeds a cyclic redundancy check code particularly for compressed coded data.

In recent data storage apparatuses using a magnetic tape, there has been adopted a method of compressing data by a compression circuit and storing the compressed data in a magnetic tape in order to increase the capacity of data storage. After the compression circuit compresses raw data sent from a CPU or the like by using a run length method for example, a cyclic redundancy check code (hereinafter called CRCC) is calculated in accordance with a generating polynomial, and the calculated CRCC is compared with a CRCC of the raw data to detect data error.

With data compression through such a run length method, if there are consecutive same data bytes in raw data, the consecutive data bytes are transformed into compressed data constructed of the data content and the number of consecutive data bytes. Therefore, data after subjected to such transformation include therein the compressed data and the data not compressed because of its discontinuity. The length of data to be compressed is, for example, a maximum of 255 bytes, and the data applicable to compression are, for example, a maximum of 256 types.

With a conventional calculation circuit for a CRCC, data after subjected to transformation include therein compressed and uncompressed data and a CRCC is calculated after the raw data are restored from the compressed data. Therefore, there arises a problem that a long operation time is required.

A technique of calculating a CRCC is known, for example, in JP-A-57-25046.

SUMMARY OF THE INVENTION

It is an object of the present invention to eliminate the problems associated with prior art calculation circuit, and provide a fast calculation circuit capable of calculating a CRCC for compressed data at high speeds.

In order to achieve the above object, an aspect of the present invention resides in that a fast calculation circuit for calculating a CRCC for compressed data composed of a compressed area and uncompressed area comprises first calculation means for calculating a CRCC for data in the uncompressed area on the basis of a generating, polynomial; second calculation means for calculating a CRCC for data in the compressed area on the basis of the content of the data and the number of consecutive data bytes; and detection means for detecting the compressed area.

In the fast calculation circuit constructed as above, when a compressed area is detected with detection means, the data in the compressed area is inputted to the second calculation means to calculate a CRCC for the data in accordance with the data content and consecutive data byte number contained within. When a compressed area is not detected, the data in an uncompressed area is inputted to the first calculation means to calculate a CRCC for the data.

According to the fast calculation circuit of this invention, a CRCC calculation is carried out without restoring raw data from the compressed data, area, thus allowing an error to be detected at high speeds.

BRIEF DESCRIPTION OF THE DRAWINGS

FIG. 2 shows diagrams used for explaining compressed data applied to the embodiment, wherein FIG. 2(a) is a diagram showing raw data before compression and FIG. 2(b) is a diagram showing data after compression;

FIG. 3 shows an example of a fast calculation matrix; and

FIG. 4 shows an example of a calculation result shifting circuit.

DESCRIPTION OF THE PREFERRED EMBODIMENTS

Prior to describing preferred embodiments, a calculation circuit according to a prior art will further be clarified.

In a calculation circuit according to a prior art as in JP-A-57-25046, a CRCC calculation is performed, for example, after raw data of several hundred bytes have been recovered from the compressed data of several bytes, resulting in a long operation time. Therefore, it is not possible to sequentially and continuously calculate CRCCs for the compressed data, posing the inconvenience that even for compressed data, a long operation time is required. In addition, a long operation time is associated with the problem that data transfer to a data storage apparatus using a magnetic tape is interrupted until a CRCC calculation for the raw data recovered from the compressed data has been completed. According to the present invention, the above-described problems are solved so that a CRCC can be calculated at high speed.

A fast calculation circuit for a CRCC of this invention will be described in detail with reference to the accompanying drawings.

Figure 1:
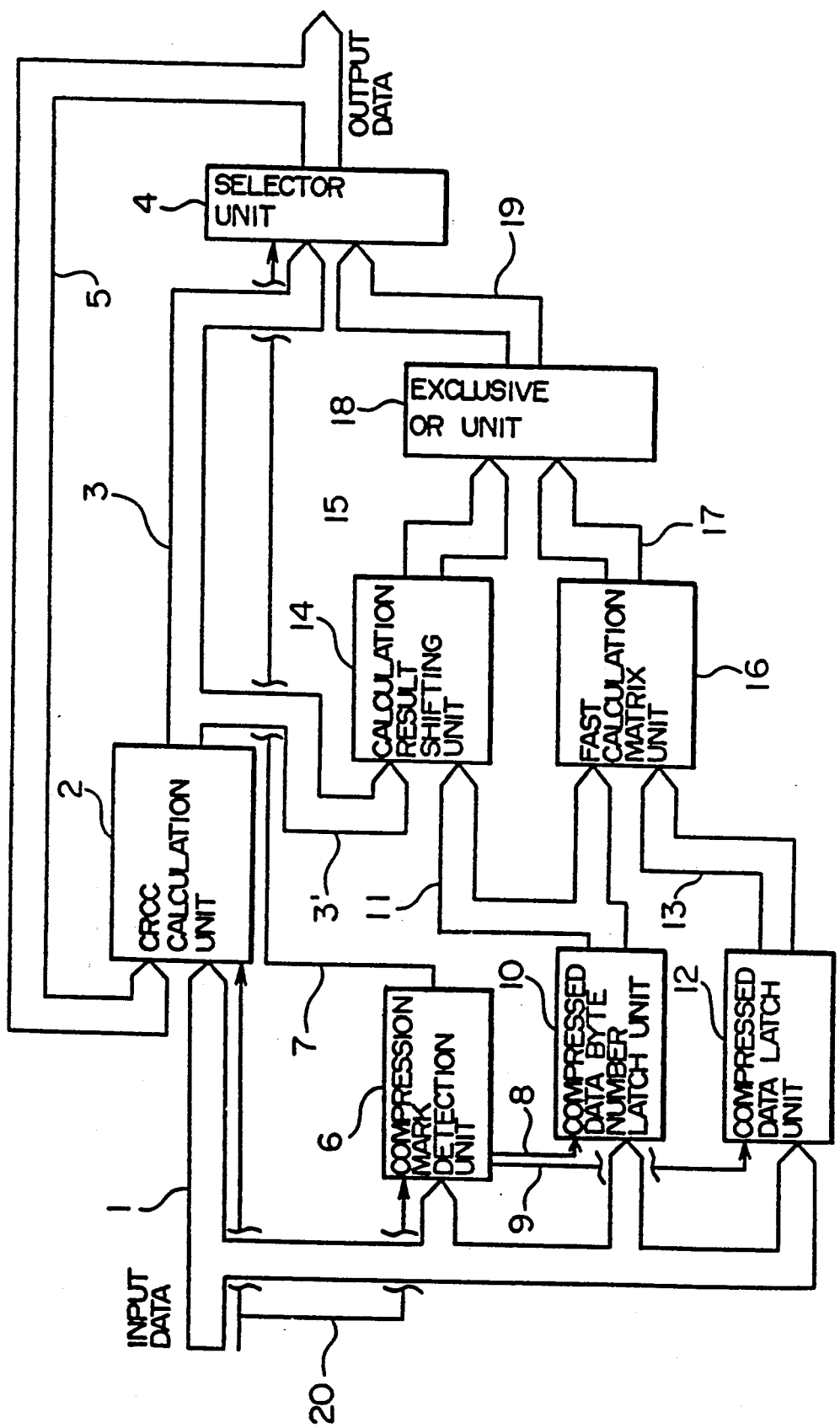
FIG. 1 is a block diagram showing an embodiment of a fast calculation circuit of this invention.
Figure 2:
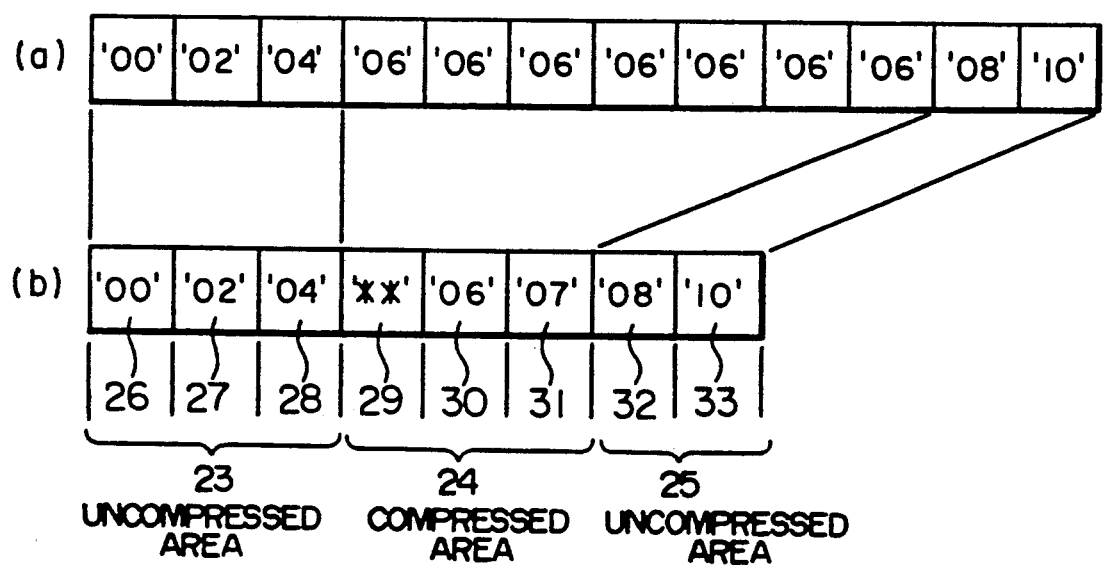

FIG. 1 is a block diagram showing an embodiment of a fast calculation circuit according to the present invention, and FIG. 2 shows diagrams respectively for raw data and compressed data.

Exemplary raw data and compressed data applicable to the present embodiment will first be described with reference to FIG. 2. Raw data before compression process shown in FIG. 2(a) are constructed of numerical data "00", "02", "04", seven consecutive numerical data "06", and numerical data "08", "10". Respective numerical data are constructed of one byte. After subjecting the raw data to a compression process by the run length method, the consecutive numerical data "06" are compression-transformed, as shown in FIG. 2(b), into a compressed area 24 composed of a compression mark 29 ("**") indicating data compression, the content 30 ("06") of the numerical data, and the number 31 ("07") of consecutive data bytes. Therefore, the raw data are compressed into an uncompressed area 23 composed of numerical data 26, 27 and 28, the compressed area 24 composed of the compression mark 29, numerical data content 30 and consecutive data byte number 31, and an uncompressed area 25 composed of numerical data 32 and 33.

The compressed data are inputted to a fast calculation circuit shown in FIG. 1 for high speed CRCC calculation. The fast calculation circuit comprises a compression mark detection unit 6, a compressed data byte number latch unit 10, a compressed data latch unit 12, a fast calculation matrix (calculation unit) 16, a CRCC calculation unit 2, a calculation result shifting unit 14, an exclusive OR unit 18, and a selector unit 4.

The compression mark detection unit 6 detects a compression mark "*" from compressed data inputted thereto in synchronism with a strobe signal 20. The compressed data byte number latch unit 10 stores the number of consecutive bytes of compressed data in response to a strobe signal 8 when a compression mark is detected by the compression mark detection unit 6. At the same time, the compressed data latch 12 stores the compressed data content in response to a strobe signal 9. The fast calculation matrix unit (calculation unit) 16 performs fast calculation associated with the compressed data based on the data sent from the latch units 10 and 12, and outputs the result onto a data bus 17. The CRCC calculation unit 2 performs a usual CRCC calculation for inputted uncompressed data on the basis of a generating polynomial, and outputs the result onto a data bus 3. The calculation result shifting unit 14 performs, on the basis of the generating polynomial, an idle shift of the CRC calculation result which is obtained by the time when compressed data bytes are input, the total number of the idle shift being equal to the number of the compressed data byte count. The exclusive OR unit 18 performs an exclusive OR operation of the outputs from the calculation result shifting unit 14 and fast calculation matrix unit 16, and outputs the result onto a data bus 19. The selector unit 4 selectively delivers an output either from the exclusive OR unit 18 or from the CRCC calculation unit 2.

The fast calculation matrix unit 16 is a memory which previously stores therein CRCC calculation results for the combinations of plural compressed data and plural data lengths (i.e., data byte numbers), and outputs a calculation result of compressed data on the basis of the compressed data byte number and data content respectively inputted from the data buses 11 and 13, the detail of which will be described later. The calculation result shifting unit 14 has a function to perform on the basis the generating polynomial, an idle shift of the CRC calculation result which is obtained by the time when compressed data byes are input, to total number of the idle shift being equal to the number of the compressed data byte count. This function is for compensating for a displacement of the previous calculation result by the amount of the compressed data byte number, the displacement resulting from performing a calculation for a whole of the compressed data area at once which, in fact, must be subjected to calculation on one-byte-by-one-byte basis. The calculation result shifting unit will be later described in detail.

As described above, the fast calculation circuit of this embodiment is constructed such that the CRCC calculation circuit 2 calculates a CRCC for an uncompressed area, while the fast calculation matrix unit 16 calculates (converts) a CRCC for a compressed area.

In the fast calculation circuit constructed as above, a CRCC calculation for the compressed data shown in FIG. 2(b) is carried out as in the following. First, when the numerical data 26 in the uncompressed area 23 are inputted in synchronism with the strobe signal 20, the compression mark detection unit 6 detects no compression mark 29 ("*") so that it causes, via a signal line 7, the selector unit 4 to select the data bus 3. A CRCC of the inputted numerical data 26 is calculated at the CRCC calculation unit 2, the calculation result being fed back to the unit 2 via the data bus 3, selector unit 4 and data bus 5. Similarly, the CRCCs of the next numerical data 27 and 28 are calculated at the CRCC calculation unit 2, the results being fed back to the unit 2, thus completing the calculation for the uncompressed area 23.

When the compression mark 29 in the compressed area 24 is inputted next, it is detected by the compression mark detection unit 6 so that it causes, via the signal line 7, the selector unit 4 to select the data bus 17. Then, the numerical data content 30 ("06") is stored in the compressed data latch unit 12, and the numerical data byte number "07" in the compressed area 24 is stored in the compressed data byte number latch unit 10. The data byte number 31 and content 30 stored in the latch units 10 and 12 are supplied via the data busses 11 and 13 to the fast calculation matrix unit 16 whereat a CRCC calculation (conversion) is carried out and the result is outputted onto the data bus 17. At this time, the calculation result shifting unit 14 is inputted from a data bus 3' with the previous CRCC calculation result (calculation result for the uncompressed area 23) for compensation for the calculation result through an idle shift by the amount of the compressed data byte number supplied via the data bus 11. These calculation results are subjected to an exclusive OR operation at the exclusive OR unit 18d so that the CRCC calculation results for the uncompressed area 23 and compressed area 24 are fed back to the CRCC calculation unit 2 via the selector unit 4 and data bus 5.

The numerical data 32 and 33 are thereafter inputted, and a CRCC calculation similar to that for the uncompressed area 23 is carried out at the CRCC calculation unit 2, the results being fed back to the unit 2. At this time the compression mark detection unit 6 is reset for preparation of the strobe signal 20 and uncompressed area 25 to be next inputted.

When the numerical data 32 and 33 in the uncompressed area 25 are inputted, a CRCC calculation is carried out at the CRCC calculation unit 2 in the similar manner described as above, to thus complete the CRCC calculation of the compressed data shown in FIG. 2.

As appreciated from the foregoing description of the embodiment of the fast calculation circuit, the data in the compressed area 24 are calculated at high speeds at the fast calculation matrix unit 16. Therefore, a CRCC calculation can be performed at high speeds without restoring uncompressed data from the data in the compressed area as conventional, accordingly preventing interruption of compressed data transfer and detecting data error at high speeds.

FIG. 3 shows an example of a fast calculation matrix stored in a memory constituting the fast calculation matrix 16. The first calculation matrix in the memory stores CRCC calculation results (such as bytes 1A, 22, 3D in hexadecimal) for various combinations of the contents of compressed raw data and the numbers of compressed data bytes, respectively to be stored in the compressed data latch 12 and compressed data byte number latch 10. By using the fast calculation matrix constructed as above, a CRCC of respective compressed data can be obtained immediately without restoring raw data from compressed data. Instead of the fast calculation matrix constructed as above and without using the memory, a logical circuit may be used which responds to the inputted data in the compression area and calculates a CRCC for the inputted data on the basis of the data content and data byte number contained in the inputted data.

Next, the calculation result shifting unit 14 will be described.

First, a usual (without an idle shift) CRCC calculation method using a generating polynomial will be described. A CRCC is obtained by the following equation (1), assuming that the input data are D0, D1, D2 and D3, and a generating polynomial is $G2 = x^9 + x^6 x^5 + x^4 + x^3 + x^0$.

$$CRCC = (((D_0X^0)X^1 \oplus D_1X^0)X^1 \oplus D_2X^0)X^1 \oplus D_3X^0 \quad (Mod\ G2) \quad (1)$$

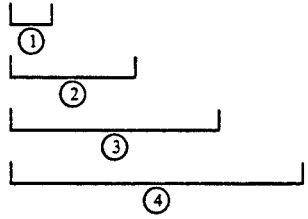

where ①,②,③ and ④ represent calculation result for first byte data D0, second byte data D1, third byte data D2, and fourth byte data D3, respectively, and $\oplus$ represents an exclusive OR.

Next, assuming that the D1 and D2 are the same, namely, D4, then the above equation (1) can be transformed into the following equation (2):

$$\begin{aligned}CRCC &= (((D_0X^0)X^1 \oplus D_4X^0)X^1 \oplus D_4X^0)X^1 \oplus D_3X^0 \quad (Mod\ G2) \quad (2)\\ &= (D_0X^2 \oplus (D_4X^0)X^1 \oplus D_4X^0)X^1 \oplus D_3X^0\end{aligned}$$

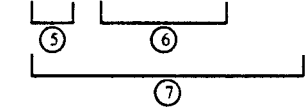

Where $D_0x^{10}$ in ⑤ corresponds to an operation by the calculation result shifting unit 14 whereby an idle shift is carried out two times on the basis of the generating polynomial (G2) so as to make it possible to represent D0 data by $x^2$. ⑥ corresponds to an operation by the fast calculation matrix unit 16 whereby D4 data are subjected to a fast calculation. ⑦ corresponds to an operation by the exclusive OR unit 18 whereby the EOR of the calculation results at ⑤ and ⑥ represents a CRCC to be obtained.

It can thus be understood that the consecutive data ⑤ (i.e., compressed data) and data ⑥ (i.e., previous calculation result) before an input of consecutive data can be calculated independently from each other and that it is necessary to idle shift the data 5 by the number of the consecutive data byte count.

FIG. 4 shows an example of the arrangement of the calculation result shifting unit 14.

A CRCC calculation for consecutive data can be obtained at high speed using the fast calculation matrix. Data (previous calculation result) before an input of consecutive data should also be calculated at high speed in order not to lower an operation speed.

Similar to the case of the fast calculation matrix, the calculation result shifting unit has a matrix as shown in FIG. 4. Results for the combinations of previous calculation results and numbers of idle shifts are previously stored in a memory from which the corresponding result data are read.

The calculation result shifting unit is realized by a memory in this embodiment. However, a logical circuit may be used instead, which calculates the idle-shift results on the basis of the previous CRCC calculation result and number of idle shifts.

As described so far, according to the present invention, a CRCC calculation for data in an uncompressed area is carried out using a usual generating polynomial, while a CRCC for data in a compressed area is derived from a fast calculation matrix unit which previously stores calculation results. Therefore, a CRCC calculation for compressed data can be performed at high speed.

The present invention is not limited to a data storage for a magnetic tape, but it can be applied to various other storage medium such as magnetic disks and the like.

We claim:

1. A fast calculation circuit to calculate a cyclic redundancy check code for compressed raw data having a compressed area and an uncompressed area, said compressed area containing a content byte, a compression mark and a number byte, said content byte being representative of a plurality of consecutive identical raw data bytes before compression, said number bytes being representative of a total number of the plurality of consecutive identical raw data bytes before compression, and said compression mark designating the compressed area, comprising:

first calculation means for calculating a cyclic redundancy check code of data in said uncompressed area on the basis of a generating polynomial;

second calculation means for calculating a cyclic redundancy check code of data in said compressed area on the basis of the content byte and number byte contained in said compressed data;

detection means for detecting said compressed area by detecting the compression mark and said uncompressed area prior to cyclic redundancy check code calculation; and means, connected to the detection means and to said first and said second calculation means, for selecting either a first output of said first calculation means when the detection means detects the compressed area or a second output of said second calculation means when the detection means detects the uncompressed area;

wherein when said detection means detects said compressed area, a cyclic redundancy check code of data in said compressed area is calculated by said second calculation means, and when said detection means detects said uncompressed area, a cyclic redundancy check code of data in said uncompressed area is calculated by said first calculation means.

2. The fast calculation circuit according to claim 1, wherein said second calculation means includes memory means for storing prior cyclic redundancy check codes each being determined in accordance with a corresponding content byte and a number byte.

3. The fast calculation circuit according to claim 1, wherein said second calculation means includes logical calculation means responsive to data in said compressed area for calculating a cyclic redundancy check code of said data, in accordance with the corresponding content byte and the number byte contained in said compressed area.

4. The fast calculation circuit according to claim 3, wherein said second calculation means further includes:

means, responsive to detection of said compressed area by said detection means, for idle-shifting a cyclic redundancy check code calculation of data preceding said compressed area; and means for XORing an output of said second calculation means and an output of said idle-shift means, a result of which is inputted to said selection means.

5. The fast calculation circuit according to claim 4, wherein said idle-shift means includes memory means for storing previous results of an idle-shift determined for each combination of the number bytes contained in said compressed area and a cyclic redundancy check code calculation of data preceding said compressed area.

6. The fast calculation circuit according to claim 5, wherein said idle-shift means includes logical calculation means for calculating the idle-shift result based on the number bytes contained in said compressed area and the cyclic redundancy check code calculation of data preceding said compressed area.

7. The fast calculation circuit according to claim 3 wherein said logical calculation means includes means for calculating a cyclic redundancy check code of the compressed area without prior restoration of raw data from the compressed data.

* * * * *